(12) United States Patent
Yang et al.

(10) Patent No.: US 8,217,689 B2
(45) Date of Patent: Jul. 10, 2012

(54) METHOD AND CIRCUIT FOR DISPLAYPORT VIDEO CLOCK RECOVERY

(75) Inventors: Lu Yang, Shanghai (CN); Sibing Wang, Shanghai (CN); Xiaoqian Zhang, Shanghai (CN)

(73) Assignee: Integrated Device Technology, Inc., San Jose, CA (US)

( * ) Notice: Subject to any disclaimer, the term of this patent is extended or adjusted under 35 U.S.C. 154(b) by 228 days.

(21) Appl. No.: 12/675,106

(22) PCT Filed: Jan. 19, 2010

(86) PCT No.: PCT/CN2010/070256
§ 371 (c)(1),
(2), (4) Date: Feb. 24, 2010

(87) PCT Pub. No.: WO2011/088610
PCT Pub. Date: Jul. 28, 2011

(65) Prior Publication Data
US 2011/0267116 A1 Nov. 3, 2011

(51) Int. Cl.
*H03L 7/06* (2006.01)
(52) U.S. Cl. .................... 327/156; 327/147
(58) Field of Classification Search .................. 327/147, 327/156
See application file for complete search history.

(56) References Cited

U.S. PATENT DOCUMENTS

| | | | |
|---|---|---|---|
| 5,506,627 A * | 4/1996 | Ciardi | 348/515 |
| 6,157,646 A | 12/2000 | Nichols | |
| 6,236,697 B1 | 5/2001 | Fang | |
| 6,363,073 B2 | 3/2002 | Nichols | |
| 6,985,552 B1 * | 1/2006 | King | 375/376 |
| 7,088,398 B1 | 8/2006 | Wolf et al. | |
| 7,355,652 B2 * | 4/2008 | Gudmondson et al. | 348/536 |
| 7,426,651 B2 * | 9/2008 | Champion et al. | 713/501 |
| 2006/0077296 A1 * | 4/2006 | Gudmundson et al. | 348/497 |
| 2006/0103760 A1 * | 5/2006 | Johnson et al. | 348/515 |
| 2007/0058078 A1 * | 3/2007 | Champion | 348/513 |
| 2007/0091935 A1 * | 4/2007 | Yonezawa et al. | 370/503 |
| 2011/0159835 A1 * | 6/2011 | Xuan et al. | 455/323 |
| 2011/0248754 A1 * | 10/2011 | Neumann | 327/156 |
| 2011/0274153 A1 * | 11/2011 | Baker et al. | 375/224 |

FOREIGN PATENT DOCUMENTS

| | | |
|---|---|---|
| CN | 1928771 A | 3/2007 |
| WO | WO 2009/117369 A1 | 9/2009 |

OTHER PUBLICATIONS

PCT International Search Report and the Written Opinion mailed Oct. 28, 2010, in related International Appl. No. PCT/CN2010/070256.

* cited by examiner

*Primary Examiner* — Lincoln Donovan
*Assistant Examiner* — Adam Houston
(74) *Attorney, Agent, or Firm* — Hayes and Boone LLP

(57) ABSTRACT

A method and a circuit are described for recovery of video clocks for a DisplayPort receiver. The disclosure includes two clock dividers, a direct digital synthesis (DDS), a fixed multiplier Phase-Locked Loop (PLL) on a DisplayPort video system. A DisplayPort receiver link clock is divided to a lower frequency as the input of the DDS which can lower the performance requirement on a DDS circuit. The output from a time stamp value indirectly controls a direct digital synthesis device, which then drives a PLL to generate the recovery clock signal. The technique is suitable for implementation on an integrated circuit and Field Programmable Gate array system.

4 Claims, 4 Drawing Sheets

METHOD AND CIRCUIT FOR DISPLAYPORT VIDEO CLOCK RECOVERY

REFERENCE TO RELATED APPLICATIONS

This application claims priority to International Application No. PCT/CN2010/070256 entitled, "METHOD AND CIRCUIT FOR DISPLAY PORT VIDEO CLOCK RECOVERY", filed on Jan. 19, 2010, and all the benefits accruing therefrom under 35 U.S.C. 371, the contents of which are herein incorporated by reference in their entirety.

TECHNICAL FIELD

The present invention is generally related to the field of stream video clock recovery in digital communication and, more specifically, to video clock recovery for DisplayPort receivers.

DISCUSSION OF RELATED ART

The DisplayPort standard delivers high performance digital connectivity for many video applications at home or at work. The DisplayPort standard allows for multiple video streams over single physical connection and supports internal chip-to-chip communication by driving display panels directly, allowing for cheaper and slimmer displays. Therefore, The DisplayPort standard allows the production of ultra-thin monitors and displays to be a reality due to its exclusive direct drive capability, enabling monitors to take up less desk space while delivering high quality visual performance. Recently, a high-definition multimedia interface DisplayPort for transmitting digital video and audio contents have been standardized. The standard is available through Video Electronics Standard Association (VESA).

In accordance with the DisplayPort standard the clock signal is embedded in the data signal. The task of recreating the video pixel clock rate or the audio sample clock rate is called stream clock recovery. There are a variety of stream clock recovery methods that can be implemented, each method having a different set of performance characteristics.

A common clock recovery or regeneration method is based on a fractional-N phased locked loop (PLL). For example, U.S. Pat. No. 7,088,398 discloses an audio clock regeneration method by applying fractional-N PLL. However, a fractional-N PLL circuitry typically is a complicated and costly structure.

Previous work on clock recovery using Direct Digital Synthesis (DDS), for example as disclosed in U.S. Pat. Nos. 6,157,646 and 6,363,073, itself does not reduce the bandwidth performance requirement and the display cost in a DisplayPort system.

Accordingly, it is desirable to provide for satisfactory and practical solutions for stream clock recovery in a DisplayPort system.

SUMMARY

Consistent with embodiments of the present invention, a stream clock recovery device for the DisplayPort standard is provided. The stream clock recovery device includes a receiver receiving a clock data along with its time stamped values; the receiver further comprising: a first clock divider to divide the clock frequency to a lower frequency; a fixed multiplier phase locked loop (PLL) device for synthesizing an output clock; a digital control logic circuit that converts the time stamped values into a reference clock and a divider factor; a direct digital synthesis (DDS) device, wherein the DDS takes the frequency-divided signal from the first clock divider and the reference clock, and synthesizes an input signal for the PLL device; and a second clock divider that applies the divider factor to the PLL output clock to create a recovered clock signal.

Systems according to the present invention do not need a fractional-N PLL, which is hard to implement in a Field Programmable Gate Array (FPGA) system and is expensive to implement.

BRIEF DESCRIPTION OF THE DRAWINGS

Some embodiments of the present invention will be described more fully below with reference to the accompanying drawings. This invention may, however, be embodied in many different forms and should not be construed as being limited to the embodiments set forth herein.

DETAILED DESCRIPTION

In the following description, specific details are set forth describing some embodiments of the present invention. It will be apparent, however, to one skilled in the art that some embodiments may be practiced without some or all of these specific details. The specific embodiments disclosed herein are meant to be illustrative but not limiting. One skilled in the art may realize other material that, although not specifically described here, is within the scope and the spirit of this disclosure.

Figure 1:
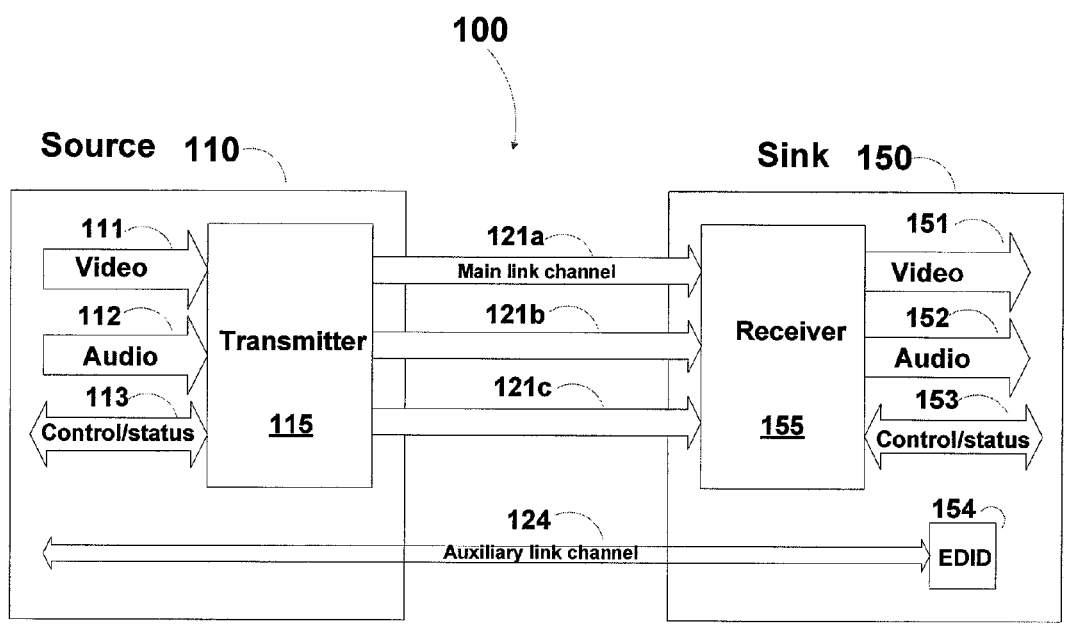
FIG. 1 shows an overview of a general high definition multimedia digital content transport system.

FIG. 1 shows a general architecture of a high definition multimedia digital content transport system 100. Such a system typically includes a source device 110 that includes a transmitter 115, a sink device 150 that includes a receiver 155, and perhaps a number of additional repeaters or other devices, interconnected by one or more uni-directional, high-speed, and low-latency serial main link channel 121 (link channels 121a, 121b, and 121c are specifically shown) designed to transport isochronous streams such as uncompressed digital video data 111, digital audio data 112, and control/status data 113. At the sink 150, receiver 155 receives and outputs a video signal 151, an audio signal 152, and a control/status signal 153. In addition, an auxiliary link channel 124 can be utilized to transport data 154, which may include Extended Digital Identification Data (EDID).

Figure 2:
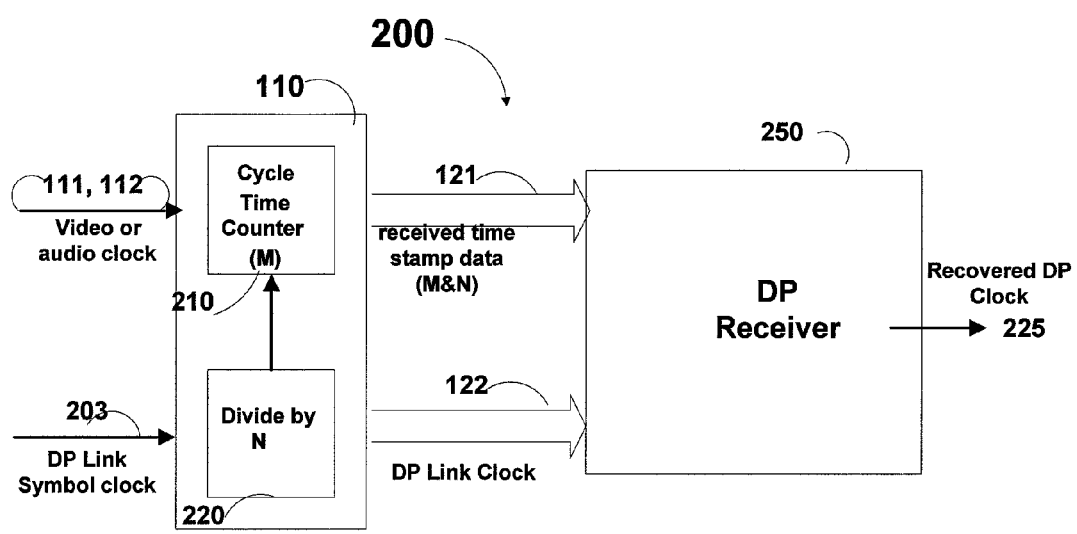
FIG. 2 shows a clock regeneration model including a DisplayPort (DP) receiver, consistent with some of the disclosed embodiments.

In many stream clock recovery systems, the video data 111 and audio stream data 112 being carried across the main serial link channel 121 may not retain the original video pixel clock rate or audio sample clock rate. The serial link channel 121 is driven by a high speed clock running at a different rate than the original video pixel clock rate or the audio sample clock rate. For example, in the DisplayPort standard, the main serial link channel 121 clock rate is fixed at either 1.62 Gbps or 2.7 Gbps, irrespective of the input video or audio clock rates. In the HDMI standard, the main serial link channel 121 clock runs at the TMDS (Transition Minimized Differential Signaling) clock rate, which corresponds to the video pixel rate, but is independent of the audio sample clock rate. In both HDMI and DisplayPort standards, a fractional relationship timestamped clock regeneration model 200 such as that shown in FIG. 2 can be defined. The values M and N are integers representing frequencies in clock recovery. M is a dynamic parameter that is counted based on the incoming daa signals, and N is a static parameter that depends on the relevant communication standard of the system. Source 110 includes a cycle time counter 210 to count the frequency parameter M from input video clock 111 and audio clock 112. A DisplayPort (DP) link symbol clock 203, which typically runs at 10 percent of the clock rate of the main link channel 121, drives a "divide by N" operation, performed by a divider 220, to the counted frequency parameter M from the cycle time counter 210. The stream data including M and N is carried by main link channel 121 to DisplayPort (DP) receiver sink 250, which provides a recovered DP clock signal 225.

A problem occurs for the above stream clock recovery method when the M & N values at sink 150 are not equal to the original M & N values at the source 110, which is typically caused by bit error in link channel 121 or imperfect measurement mechanisms at source 110. In the ideal case, where the received M & N values are equal to the original M & N values, fractional long-term accuracy of the recovered stream clock is the same as that of the original. But in the non-ideal case where the received M & N values are not equal to the original M & N values, frequency deviation between source 110 and sink 150 in FIG. 1 will accumulate over time, leading to a phase offset between read and write operations.

Figure 3:
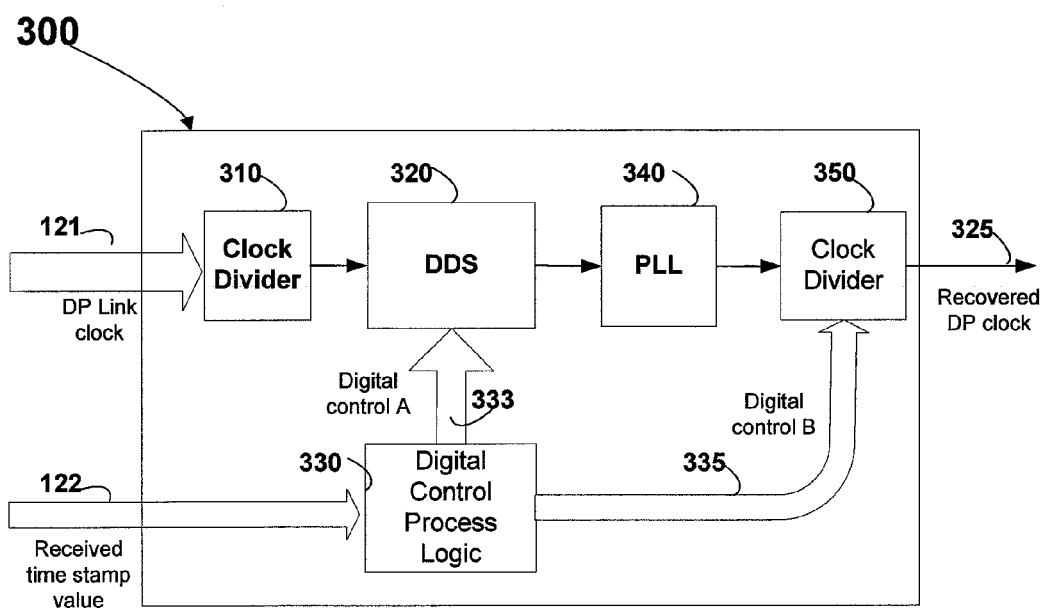
FIG. 3 describes an embodiment of the disclosed DP clock recovery circuit including a DDS and a fixed multiplier PLL, consistent with the present invention.

FIG. 3 illustrates a block diagram for a DisplayPort receiver 300 according to some embodiments of the present invention. The DisplayPort receiver 300 includes: a clock divider circuit 310 receiving a DP link clock data from a main link channel 121 and dividing it to a lower frequency input data for a Direct Digital Synthesizer (DDS) 320. DDS is used here as a means to generate a frequency- and phase-tunable output signal referenced to a fixed-frequency precision clock source.

The DisplayPort receiver 300 also receives a time stamped value 122, which is processed by a Digital Control Process Logic module 330. Two digital control signals are generated by the Digital Control Process Logic 330: Digital control A 333 and Digital control B 335. Digital control A 333 provides a reference frequency signal to DDS 320. DDS 320 synthesizes a clock signal with a frequency closest to the reference frequency signal provided by the Digital control A. This output signal from DDS is used as an input to the fixed multiplier PLL 340 to be phase locked at a clock signal closest to the reference frequency. Digital control B 335 provided by the Digital Control Process Logic 330 is sent to the Clock Divider 350 to control the multiplexer factor in the Clock Divider 350. Therefore, the final recovered clock signal 325 is an accurate counting of the DP video clock rate 121$a$ in the source in FIG. 1. The received time stamp data M and N in FIG. 2 change in continuous video frames, therefore Digital control A and Digital control B change accordingly.

Figure 4:
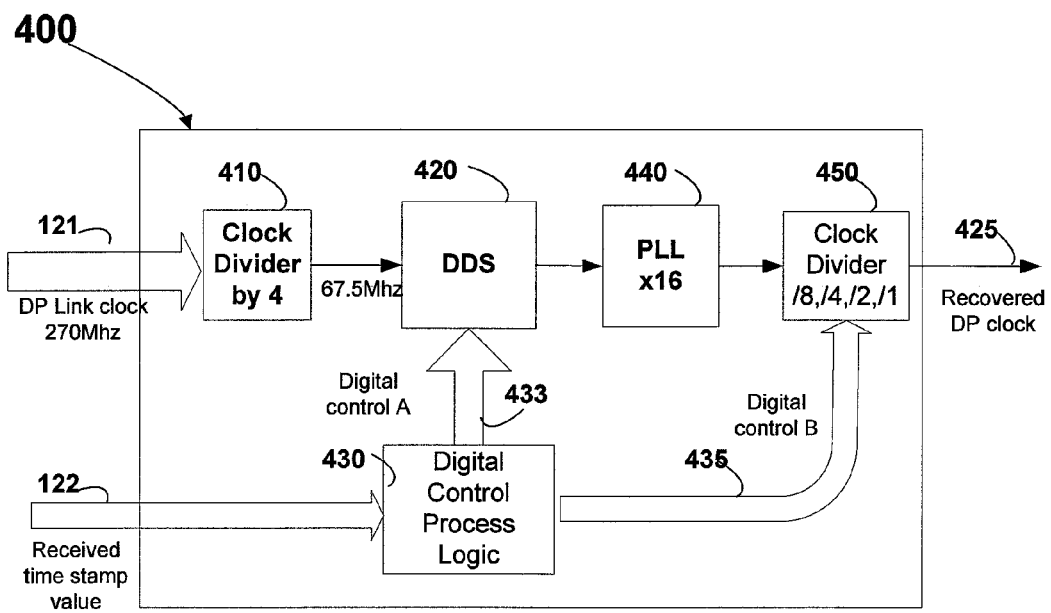
FIG. 4 describes an exemplary embodiment of the disclosed DP clock recovery circuit including a DDS and a 16× PLL, consistent with the present invention.

FIG. 4 shows an exemplary embodiment when the input DP link clock has a frequency of 270 MHz. The Clock Divider 410 divides the link clock frequency by 4 and sends the divided signal at 67.5 MHz to DDS 420 for synthesizing clocks at a much lower frequency than the link clock rate in the DDS circuitry, controlled by the reference signal input Digital control A 433 from the Digital Control Process Logic 430. DDS output is sent to PLL 440 at a fixed multiple of 16. The output of 440 is frequency-divided by Clock Divider 450 at a divider factor provided by the Digital control B 435 from the Digital Control Process Logic 430. At the end, Clock Divider 450's output 425 is delivered as the required video clock for the DisplayPort transport system. The clock divider 410 lowers the input frequency of DDS by a factor of 4 in this example, thus DDS performance requirement is significantly simplified, and the overall cost of the video transport is reduced as well.

The foregoing description is intended to illustrate but not to limit the scope of the invention, which is defined by the scope of the appended claims. Other embodiments are within the scope of the disclosure.

What is claimed is:

1. A stream clock recovery device, comprising:
   a receiver receiving a clock data along with its time stamped values;
   the receiver further comprising:
   a first clock divider to divide the clock frequency to a lower frequency;
   a fixed multiplier phase locked loop (PLL) device for synthesizing an output clock;
   a digital control logic circuit that converts the time stamped values into a reference clock and a divider factor;
   a direct digital synthesis (DDS) device, wherein the DDS takes the frequency-divided signal from the first clock divider and the reference clock, and synthesizes an input signal for the PLL device; and
   a second clock divider that applies the divider factor to the PLL output clock to create a recovered clock signal.

2. A stream clock recovery device of claim 1, wherein the clock data is from a DisplayPort channel.

3. A stream clock recovery device of claim 1, wherein the receiver is a DisplayPort receiver.

4. A stream clock recovery device of claim 1, wherein the recovered clock is a DisplayPort recovered clock.

* * * * *